United States Patent
Chu et al.

(10) Patent No.: US 6,544,828 B1
(45) Date of Patent: Apr. 8, 2003

(54) ADDING A POLY-STRIP ON ISOLATION'S EDGE TO IMPROVE ENDURANCE OF HIGH VOLTAGE NMOS ON EEPROM

(75) Inventors: Wen-Ting Chu, Hsin-Chu (TW); Di-Son Kuo, Hsin-Chu (TW); Jack Yeh, Hsin-Chu (TW); Chia-Ta Hsieh, Tainan (TW); Chrong-Jung Lin, Hsin-Tien (TW); Sheng-Wei Tsaur, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/044,860

(22) Filed: Nov. 7, 2001

(51) Int. Cl.$^7$ ................................. H01L 21/8234
(52) U.S. Cl. ................................................ 438/197
(58) Field of Search .................... 438/587, 149, 438/200, 198, 225

(56) References Cited

U.S. PATENT DOCUMENTS

| | | | |
|---|---|---|---|
| 5,340,768 A | 8/1994 | Gill | 437/61 |
| 5,376,578 A | 12/1994 | Hsu et al. | 437/56 |
| 5,451,535 A | 9/1995 | Chan et al. | 437/43 |
| 5,639,676 A | 6/1997 | Hshieh et al. | 437/40 DM |
| 5,817,570 A | 10/1998 | Kerber et al. | 438/587 |
| 5,963,480 A * | 10/1999 | Harari | 365/185.29 |
| 6,339,243 B1 * | 3/2000 | Kwon et al. | 438/202 |
| 6,118,152 A | 9/2000 | Yamaguchi et al. | 257/347 |
| 6,468,849 B1 * | 10/2002 | Efland et al. | 438/200 |

* cited by examiner

Primary Examiner—David Nelms
Assistant Examiner—Thao Le
(74) Attorney, Agent, or Firm—George O. Saile; Stephen B. Ackerman; Rosemary L. S. Pike

(57) ABSTRACT

A method for improving the endurance and robustness of high voltage NMOS devices by forming a conductive field plate at the edge of a shallow trench isolation region at the drain side only is described. Active areas are separated by isolation regions in a substrate. A gate oxide layer is grown on the active areas. A conducting layer is deposited overlying the gate oxide layer and patterned to form gate electrodes in the active areas and to form conductive strips overlapping both the active areas and the isolation areas at an isolation's edge on a drain side of the active areas wherein the conductive strips reduce the electric field at the isolation's edge in the fabrication of an integrated circuit device.

15 Claims, 3 Drawing Sheets

ADDING A POLY-STRIP ON ISOLATION'S EDGE TO IMPROVE ENDURANCE OF HIGH VOLTAGE NMOS ON EEPROM

BACKGROUND OF THE INVENTION (1) Field of the Invention

The present invention relates to the fabrication of integrated circuit devices, and more particularly, to a method of improving endurance of a high voltage memory device in the fabrication of integrated circuits.

(2) Description of the Prior Art

In the fabrication of integrated circuit devices, shallow trench isolation (STI) is often used to isolate active areas from one another, especially in advanced CMOS technology with below 0.25 $\mu$m feature sizes. Then a gate oxide layer is formed in the active areas and semiconductor device structures fabricated. The gate oxide on the edge of the STI region is weaker and has a stronger electric field than the gate oxide in other areas. This can lead to reduced endurance of high voltage NMOS, especially in non-volatile memory devices such as EPROM, EEPROM, and Flash memories. It is desired to improve the product endurance and increase robustness of the NMOS devices.

U.S. Pat. No. 6,118,152 to Yamaguchi et al, 5,817,570 to Kerber et al, U.S. Pat No. 5,451,535 to Chan et al, U.S. Pat. No. 5,639,676 to Hshieh et al, and U.S. Pat. No. 5,376,578 to Hsu et al teach various field plate conductors. U.S. Pat. No. 5,340,768 to Gill shows a field plate conductor extending over a LOCOS region between row lines of a memory array.

SUMMARY OF THE INVENTION

Accordingly, it is a primary object of the present invention to provide an effective and very manufacturable method for increasing the endurance of gate oxide at the edge of an isolation region in the fabrication of integrated circuits.

It is a further object of the invention to improve the endurance and robustness of high voltage NMOS devices.

Yet another object is to provide a method for improving the endurance and robustness of high voltage NMOS devices by forming a conductive field plate at the edge of an isolation region.

A still further object is to provide a method for improving the endurance and robustness of high voltage NMOS devices by forming a conductive field plate at the edge of an isolation region on the drain side only.

Yet another object is to provide a method for improving the endurance and robustness of high voltage NMOS devices by forming a conductive field plate at the edge of a shallow trench isolation region at the drain side only.

In accordance with the objects of the invention, a method for improving the endurance and robustness of high voltage NMOS devices by forming a conductive field plate at the edge of a shallow trench isolation region at the drain side only is achieved. Active areas are separated by isolation regions in a substrate. A gate oxide layer is grown on the active areas. A conducting layer is deposited overlying the gate oxide layer and patterned to form gate electrodes in the active areas and to form conductive strips overlapping both the active areas and the isolation areas at an isolation's edge on a drain side of the active areas wherein the conductive strips reduce the electric field at the isolation's edge in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention forms a conductive strip on the edge of an isolation region to improve endurance especially of high voltage NMOS in a non-volatile memory. It will be understood by those skilled in the art that the invention should not be limited to the embodiment illustrated in the figures, but can be extended and applied to other embodiments. Particularly, the isolation may be shallow trench isolation (STI) or local oxidation of silicon (LOCOS). The device fabricated may be a high voltage NMOS device in a non-volatile memory such as EPROM, EEPROM, or Flash memory, for example.

Figure 1:
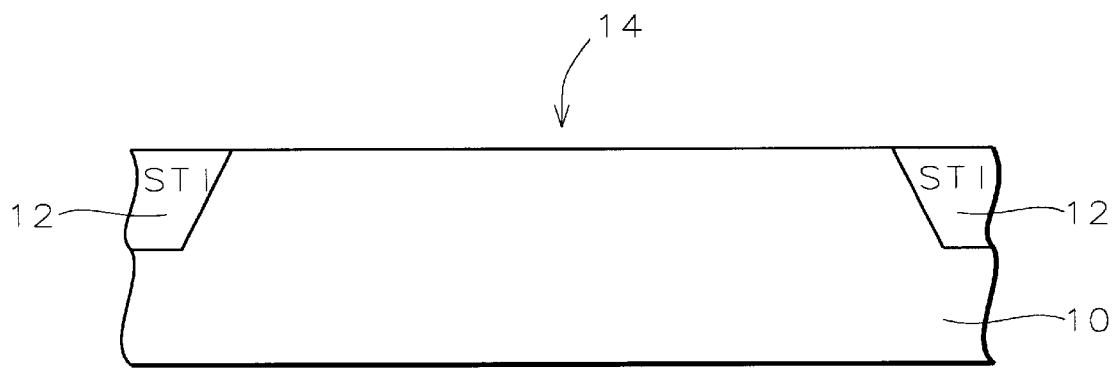
FIGS. 1 through 3 are cross-sectional representations of a preferred embodiment of the present invention.
Figure 4:
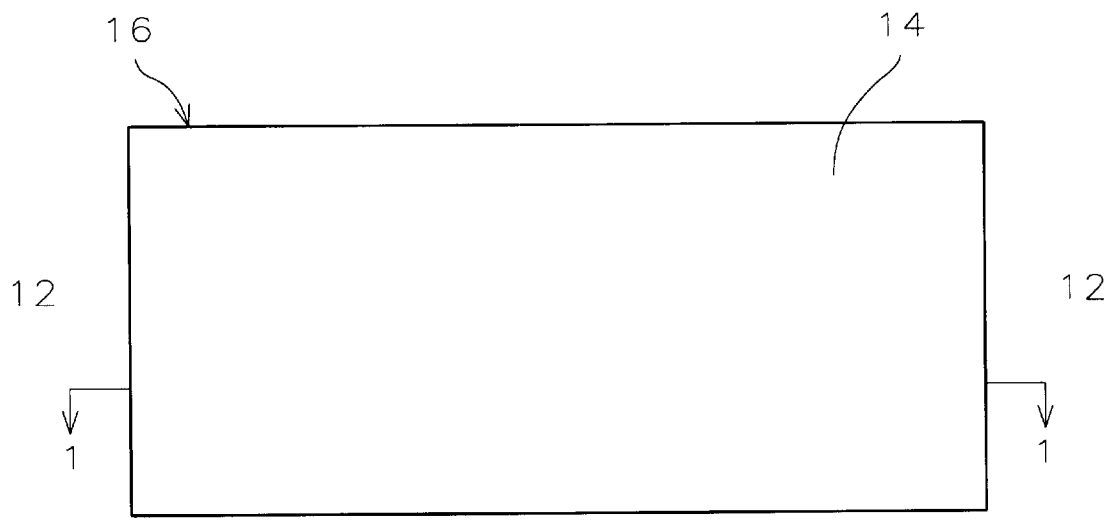
FIG. 4 is a top view of the cross-sectional view in FIG. 1.

Referring now more particularly to FIG. 1, there is shown a semiconductor substrate 10, preferably composed of monocrystalline silicon. Shallow trench isolation (STI) regions 12 are formed. FIG. 4 shows a top view of the active region 14 surrounded by STI regions 12.

It will be understood that the isolation regions could be LOCOS regions, but STI is preferred.

Figure 2:
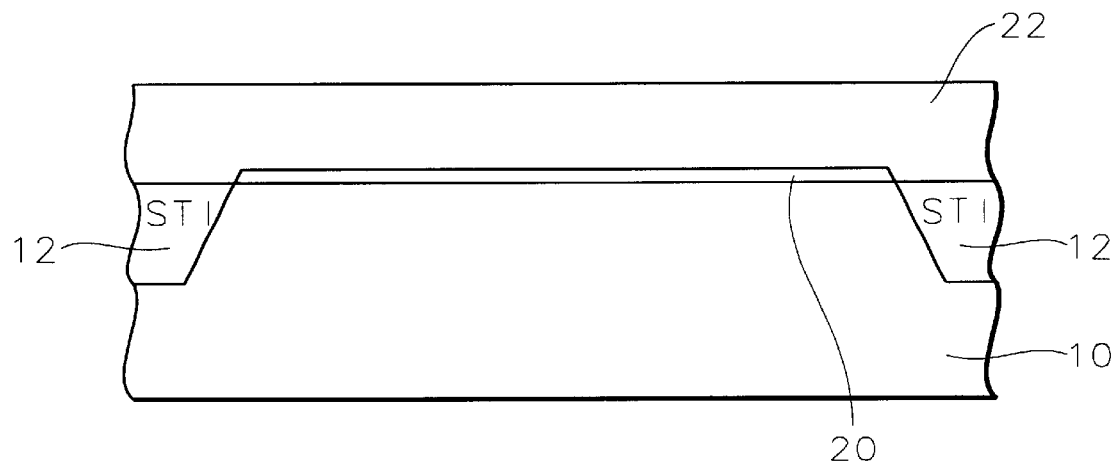

Referring now to FIG. 2, gate oxide layer 20 is grown on the surface of the active area, as is conventional in the art. Then a conductive layer, such as polysilicon, 22 is deposited over the gate oxide layer to a thickness of between about 1000 and 10,000 Angstroms. Alternatively the conductive layer could be metal or amorphous silicon.

Figure 3:
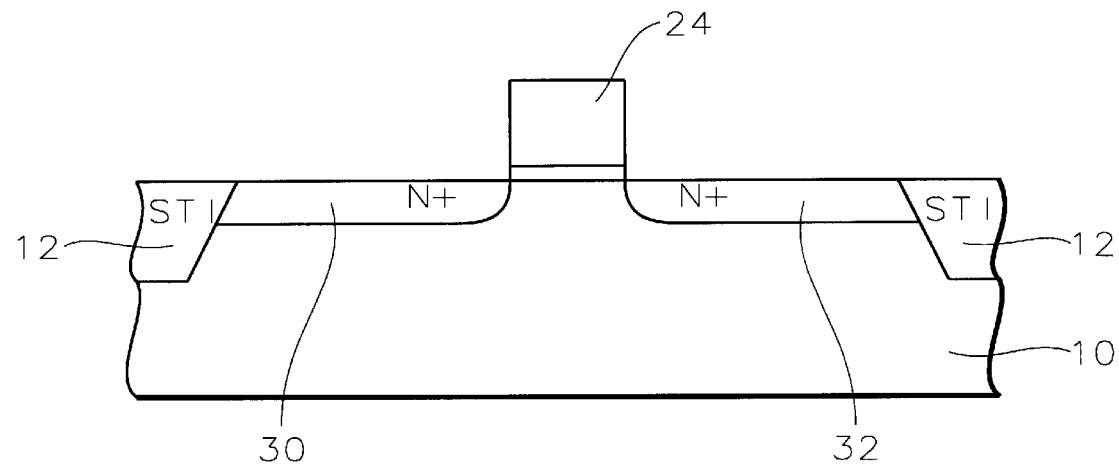
Figure 5:
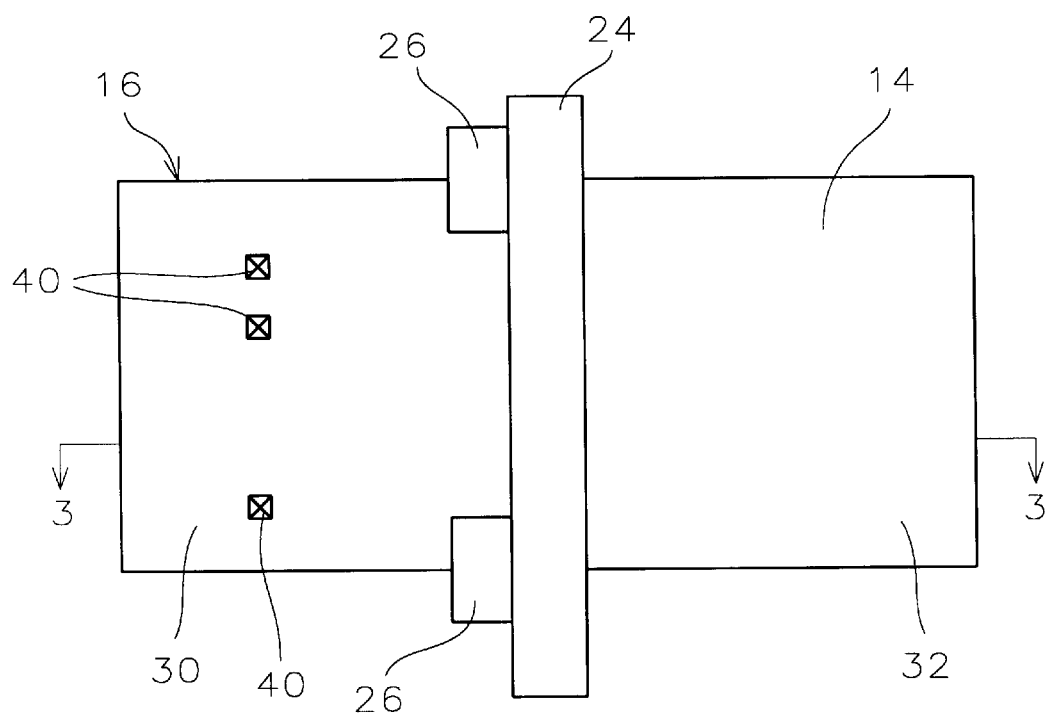
FIG. 5 is a top view of the cross-sectional view in FIG. 3.

The conductive layer 22 is patterned by conventional means to form a gate electrode 24, as shown in FIGS. 3 and 5, and a conductive strip or field plate 26 at the isolation edge, as shown in FIG. 5. The conductive strip 26 is formed at the edge 16 of the STI region only on the drain side. The presence of the conductive strip 26 will reduce the electric field around the STI's edge. This will improve the endurance of the NMOS device without sacrificing saturation current and device area. Only the drain side will see high voltage stress; the source side sees only "ground". High voltage is a killer to endurance. The conductive strip 26 may have a size of about 0.4×0.5 $\mu$m on the active region.

The process of the invention has been implemented and experiments run to test endurance. Wafers using the drain side conductive strip of the invention endured for 10,000 cycles before showing stress. Wafers not using the drain side conductive strip of the invention showed stress much sooner.

Figure 6:
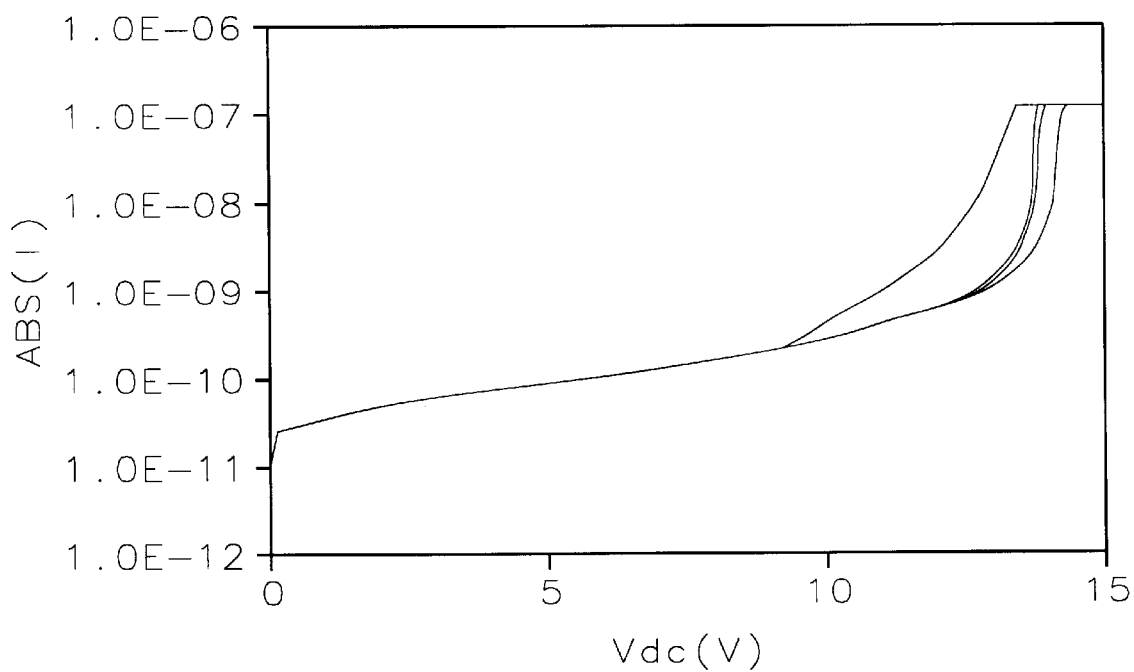
FIG. 6 is a graphical representation of current (absolute value) as a function of drain to source voltage (Vds) on wafers fabricated according to the process of the present invention.

FIG. 6 graphically illustrates current (absolute value) as a function of drain to source voltage (Vds) on wafers having the drain side conductive strip of the present invention. The graph shows that the wafers of the present invention can survive after high voltage stress; the surrent does not increase.

Figure 7:
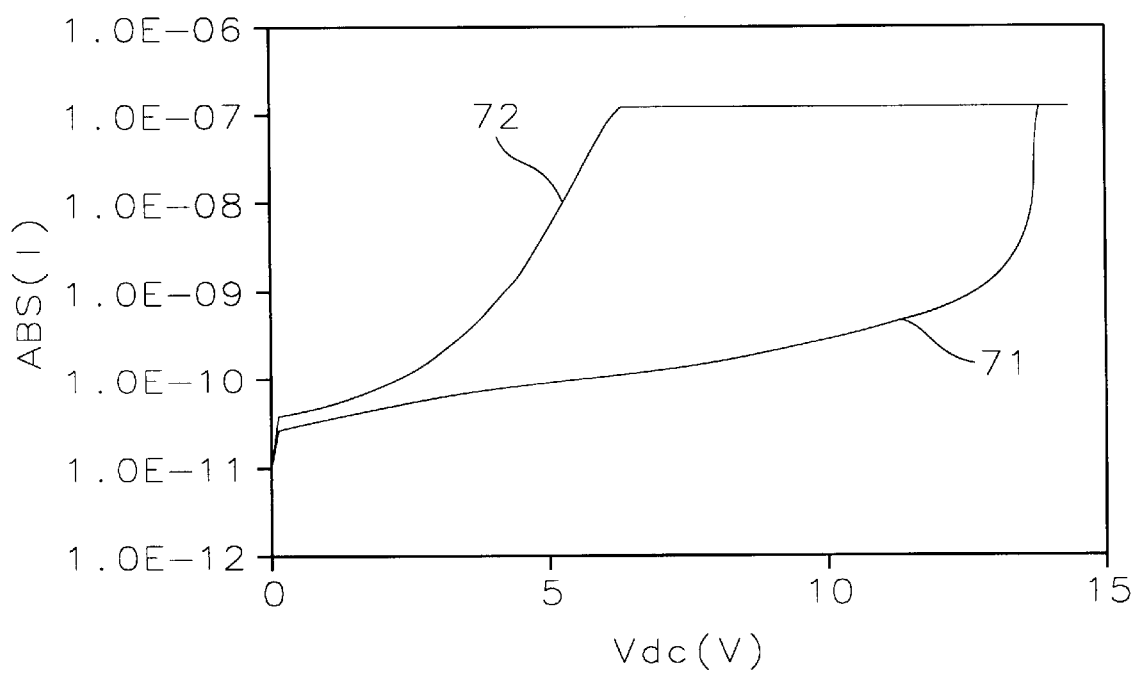
FIG. 7 is a graphical representation of current (absolute value) as a function of drain to source voltage (Vds) on wafers of the prior art.

FIG. 7 graphically illustrates current (absolute value) as a function of drain to source voltage (Vds) on traditional wafers without the drain side conductive strip of the present invention. After a first time stress (line 71), leakage current is found. After a second stress (line 72), high drain current occurs. This graph shows that the traditional wafers cannot survive stress.

The process of the present invention provides a method for increasing robustness of a high voltage NMOS device and improving endurance of the integrated circuit device. This is achieved by forming a conductive strip at the edge of the isolation region on the drain side. The conductive strip at the isolation edge reduces the electric field at the isolation edge and thus improves device endurance. Since the conductive strip is formed only at the drain side, the endurance improvement is achieved without sacrificing saturation current or device area.

While the invention has been particularly shown and described with reference to the preferred embodiments thereof, it will be understood by those skilled in the art that various changes in form and details may be made without departing from the spirit and scope of the invention.

What is claimed is:

1. A method for reducing an electric field at isolation's edge in the fabrication of an integrated circuit device comprising:

providing active areas separated by isolation regions in a substrate;

growing a gate oxide layer on said active areas;

depositing a conducting layer overlying said gate oxide layer; and patterning said conducting layer to form gate electrodes in said active areas and to form conductive strips overlapping both said active areas and said isolation areas at an isolation's edge on a drain side only of said active areas wherein said conductive strips reduce said electric field at said isolation's edge in said fabrication of said integrated circuit device.

2. The method according to claim 1 wherein said integrated circuit device is a high voltage NMOS device.

3. The method according to claim 1 wherein said reducing said electric field at said isolation's edge improves endurance of said integrated circuit device.

4. The method according to claim 1 wherein said isolation regions comprise shallow trench isolation regions.

5. The method according to claim 1 wherein said isolation regions are selected from the group consisting of: shallow trench isolation and local oxidation of silicon.

6. The method according to claim 1 wherein said conducting layer is selected from the group consisting of: polysilicon, amorphous silicon, and metal.

7. The method according to claim 1 wherein each of said conductive strips has a size of about 0.4×0.5 $\mu$m.

8. A method for reducing an electric field at isolation's edge in the fabrication of a high voltage integrated circuit device comprising:

providing active areas separated by isolation regions in a substrate;

growing a gate oxide layer on said active areas;

depositing a conductive layer overlying said gate oxide layer; and patterning said conductive layer to form gate electrodes in said active areas and to form conductive strips overlapping both said active areas and said isolation areas at an isolation's edge on a drain side only of said active areas wherein said conductive strips reduce said electric field at said isolation's edge and thereby improve endurance of said high voltage integrated circuit device.

9. The method according to claim 8 wherein said isolation regions comprise shallow trench isolation regions.

10. The method according to claim 8 wherein said isolation regions are selected from the group consisting of: shallow trench isolation and local oxidation of silicon.

11. A method for reducing an electric field at isolation's edge in the fabrication of an integrated circuit device comprising:

providing active areas separated by isolation regions in a substrate;

growing a gate oxide layer on said active areas;

depositing a polysilicon layer overlying said gate oxide layer; and patterning said polysilicon layer to form gate electrodes in said active areas and to form polysilicon strips overlapping both said active areas and said isolation areas at an isolation's edge on a drain side only of said active areas wherein said polysilicon strips reduce said electric field at said isolation's edge in said fabrication of said integrated circuit device.

12. The method according to claim 11 wherein said integrated circuit device is a high voltage NMOS device.

13. The method according to claim 11 wherein said reducing said electric field at said isolation's edge improves endurance of said integrated circuit device.

14. The method according to claim 11 wherein said isolation regions comprise shallow trench isolation regions.

15. The method according to claim 11 wherein said isolation regions are selected from the group consisting of: shallow trench isolation and local oxidation of silicon.

* * * * *